(12) United States Patent
Nishio

(10) Patent No.: US 7,173,987 B2
(45) Date of Patent: Feb. 6, 2007

(54) ANALOG FRONT END CIRCUIT

(75) Inventor: Kenichi Nishio, Kanagawa (JP)

(73) Assignee: Sony Corporation, Tokyo (JP)

( * ) Notice: Subject to any disclaimer, the term of this patent is extended or adjusted under 35 U.S.C. 154(b) by 791 days.

(21) Appl. No.: 10/181,079

(22) PCT Filed: Nov. 16, 2001

(86) PCT No.: PCT/JP01/10048

§ 371 (c)(1),
(2), (4) Date: Nov. 29, 2002

(87) PCT Pub. No.: WO02/41495

PCT Pub. Date: May 23, 2002

(65) Prior Publication Data

US 2003/0156667 A1    Aug. 21, 2003

(30) Foreign Application Priority Data

Nov. 16, 2000 (JP) .............................. 2000-349790

(51) Int. Cl.
*H04L 27/08* (2006.01)
*H04B 1/04* (2006.01)
*H04B 1/06* (2006.01)
*H04N 5/50* (2006.01)

(52) U.S. Cl. ................... 375/345; 375/297; 455/127.2; 455/127.5; 455/232.1; 455/240.1; 348/725; 348/735

(58) Field of Classification Search .............. 375/297, 375/344–346, 296, 318; 455/114.2, 67.13, 455/67.11, 572, 144.3, 127.1, 136, 127.2, 455/138, 127.3, 219, 127.5, 232.1, 240.1, 455/241.1, 245.1, 250.1
See application file for complete search history.

(56) References Cited

U.S. PATENT DOCUMENTS 4,191,995 A  *  3/1980  Farrow ........................ 700/37

(Continued)

FOREIGN PATENT DOCUMENTS

EP         0 497 587          8/1992

(Continued)

*Primary Examiner*—Kevin Kim
*Assistant Examiner*—Linda Wong
(74) *Attorney, Agent, or Firm*—Frommer Lawrence & Haug LLP; William S. Frommer; Thomas F. Presson

(57) ABSTRACT

The present invention relates to an analog front end circuit which is preferably used for taking out an image signal from a charge coupled device, that is used as image pickup means in an electronic camera such as an electronic still camera, a video camera and the like. In the present invention, an image analog signal which is produced by, for example, the charge coupled device (CCD: not shown) is supplied to a correlated double sampling circuit (CDS) 2 through an input terminal 1. The image analog signal is taken out through the CDS2, and the signal taken out from the CDS2 is supplied to an analog type programmable gain control amplifier (PGA) 4 through a changeover switch 3. Either the gain controlled signal by the analog PGA 4 or the signal sent from the changeover switch 3 is selected by a changeover switch 5. The selected signal is further supplied to, for example, a 12-bit analog digital converter (ADC) 6. The converted digital signal is supplied to a digital type programmable gain control amplifier (PGA) 7 comprised of, for example, a multiplier and is then taken out from an output terminal 8. In this manner, the noise generation and power consumption under occasional use conditions can be minimized.

3 Claims, 2 Drawing Sheets

U.S. PATENT DOCUMENTS

| | | | |
|---|---|---|---|
| 4,989,074 A * | 1/1991 | Matsumoto | 348/572 |
| 5,677,962 A * | 10/1997 | Harrison et al. | 381/109 |
| 6,696,892 B1 * | 2/2004 | Behzad | 330/51 |
| 2005/0024509 A1 * | 2/2005 | Itani et al. | 348/255 |

FOREIGN PATENT DOCUMENTS

| | | |
|---|---|---|
| JP | 56 79509 | 6/1981 |
| JP | 63 211908 | 9/1988 |
| JP | 4 246905 | 9/1992 |

* cited by examiner

ANALOG FRONT END CIRCUIT

TECHNICAL FIELD

The present invention relates to an analog front end circuit which is preferably used when an image signal is taken out from a charge coupled device used as image pickup means in an electronic camera apparatus such as an electronic still camera or a video camera. Particularly, the invention concerns an analog front end circuit which is so arranged as to enable a manner of performing gain control when the image signal is taken out to be arbitrarily changed over according to use conditions.

BACKGROUND ART

With an analog front end circuit which is used when the image signal is taken out from a charge coupled device serving as image pickup means in an electronic camera apparatus such as an electronic still camera or a video camera, a plurality of gain control methods such as those shown in FIGS. 3A to 3C have hitherto been performed.

FIG. 3A is a block diagram of an analog amplifier type analog front end circuit which performs a first method. In this circuit of FIG. 3A, an image analog signal which is produced by, for example, a charge coupled device (hereinafter abbreviated as "CCD": not shown) is supplied to a correlated double sampling circuit (hereinafter abbreviated as "CDS") 31 through an input terminal 30. The image analog signal is taken out through the CDS 31.

The signal which is taken out through the CDS 31 is supplied to an analog type programmable gain-control amplifier (hereinafter abbreviated as "the PGA") 32. To this analog PGA 32 is further supplied a gain control signal from a control circuit 33. The signal which is amplified according to the gain control signal is supplied to an analog digital converter (hereinafter abbreviated as "ADC") 34, and the converted digital signal is taken out from an output terminal 35.

In other words, this circuit of FIG. 3A is such that the analog PGA 32 performs the entire gain control as required. In order that this circuit provides a sufficient image quality for consumer use, the word length required for the ADC 34 is about 10 to 12 bits, so that a short word length is available for the ADC 34. Therefore, the circuit of low price can generally be used for the ADC 34a, and the less power consumption will also be achieved. Furthermore, the equivalent word length at the output end always corresponds with the word length of the ADC 34, and the noise level at the time of high gain is the lowest.

However, when the analog PGA 32 in the circuit, controls the entire gain range as required, the power consumption by the analog PGA 32 increases and hence the power consumption in the entire circuit also increases. Moreover, the analog PGA 32 is difficult to make linear of its gain control characteristic. Therefore, in order to obtain the linear characteristic, it becomes necessary to provide a conversion table, etc. on the relevant control software. As described above, the circuit of FIG. 3A involves such problems as the power consumption and the linearity of gain control.

In contrast, FIG. 3B is a block diagram of a digital amplifier type analog front end circuit which uses a second method. It is noted that, in that figure, the elements corresponding to those of FIG. 3A are denoted by like reference symbols. In this circuit of FIG. 3B, the signal which is taken out through the CDS 31 is supplied directly to the ADC 36. Then, the digital signal thus converted is multiplied by a gain control signal from the control circuit 33, which is performed by a digital type programmable gain control amplifier (PGA) 37.

Accordingly, in this circuit of FIG. 3B, the entire gain control as required is performed by the digital PGA 37. Because this circuit employs no analog PGA, the circuit structure is simple. In addition, there are less problems caused by the dispersion of circuits such as the offset, so that the operation becomes stable. Further, it is possible to make linear of the gain control characteristic of the digital PGA 37. As a result, providing the conversion table, etc. on the control software for obtaining the linearity can be made unnecessary.

However, in this circuit, the equivalent word length at the output end, etc. becomes smaller in inverse proportion to the gain which is the multiplication in the digital PGA 37. For this reason, in order to ensure the equivalent word length the maximum gain, it is necessary to make the word length of the ADC 36 long. Incidentally, the word length which is necessary for the ADC 36 to obtain a sufficient image quality for consumer use is about 14 bits. Accordingly, the ADC 36 having such a long word length will be large in circuit scale and also the power consumption thereof increases extremely.

Further, in the structure, for example, which omits a pre-amplifier for matching the output of the CCD with the input full scale of the ADC 36, in order to avoid the increase in the power consumption, if the maximum output level of the CCD in use is low, it will result that not all the input range of the ADC 36 are used. Therefore, the equivalent word length at the output end, etc. is reduced, which will result in a disadvantage in terms of image quality moreover, at the time of high gain, because all noises in the circuits that precede the digital PGA 37 are amplified, noises at high gain are disadvantageous.

FIG. 3C is a block diagram of a hybrid amplifier type analog front end circuit in which the analog and digital PGAs are mixed together to perform a third method. In this figure, the elements corresponding to those of FIG. 3A are denoted by like reference symbols. In this circuit of FIG. 3C, the signal which is taken out through the CDS 31 is supplied to the ADC 39 through an analog PGA 38, and the converted digital signal is supplied to the digital PGA 40. The gain control in these PGAs 38 and 40 are performed by the control circuit 33.

Accordingly, in this circuit of FIG. 3C, because the amplification is also performed by the digital PGA 40 as well, the gain of the analog PGA 38 can be made smaller than in the case of the circuit of FIG. 3A and thus the power consumption can be reduced. Also, because the amplification is performed in the analog PGA 38, the word length of the ADC 39 can be made shorter than in the case of the circuit of FIG. 3B. Note that the word length necessary for the ADC 39 in order to obtain a sufficient image quality for consumer use is about 12 bits. Therefore, the circuit which is cheap and of less power consumption can be employed for the ADC 39.

However, although this circuit of FIG. 3C is superior to the circuit of FIG. 3B in the noise at high gain but inferior to the circuit of FIG. 3A. The entire power consumption of the circuit of FIG. 3C is larger than that in the case where for example, the word length of the ADC 36 is made to be 12 bits in the circuit of FIG. 3B. In addition, problems of the instability of operation and the like due to interposing the analog PGA 38 still remain to exist as in the circuit of FIG. 3A. On the other hand, for example, in an electronic camera apparatus, there are cases where the increase in noise and the increase in the power consumption may be permitted depending on the use conditions.

DISCLOSURE OF INVENTION

The present invention is directed to enable the circuit to be switched over according to the use conditions and thereby enable the generation of noise and the power consumption to be made minimum under those occasional use conditions. For this purpose, the present invention comprises both the analog amplifier and the digital amplifier and enables them to be switched over as needed for use. In connection with that, an analog front end circuit according to the present invention will be disclosed below.

BEST MODE FOR CARRYING OUT THE INVENTION

In the following, the present invention will be described with reference to the drawings, FIG. 1 of which is a block diagram showing the structure of an embodiment of an analog front end circuit according to the present invention.

Figure 1:
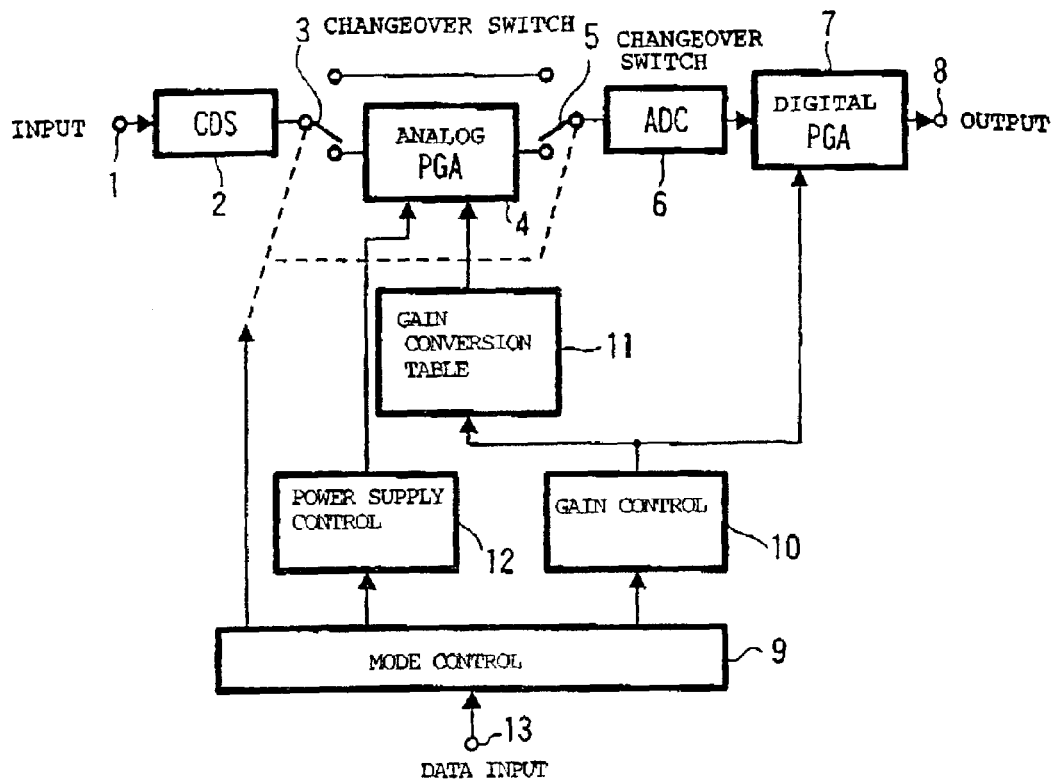
FIG. 1 is a structure diagram showing an embodiment of an analog front end circuit according to the present invention.

Referring to FIG. 1, for example, an image analog signal which is produced by a charge coupled device (CCD: not shown) is supplied to a correlated double sampling circuit (CDS) 2 through an input terminal 1. The image analog signal is taken out through the CDS 2, and the signal which is taken out through the CDS 2 is supplied to an analog type programmable gain control amplifier (PGA) 4 through a changeover switch 3.

Either the signal which is gain-controlled by the analog PGA 4 or the signal from the changeover switch 3 is selected by a changeover switch 5. The selected signal is further supplied, to, for example, a 12-bit analog digital converter (ADC) 6. The converted digital signal is then taken out from an output terminal 8 through a digital type programmable gain-control amplifier (PGA) 7, for example, which is comprised of a multiplier.

A PGA mode control circuit 9 is further provided. A signal is supplied from the PGA mode control circuit 9 to a gain control circuit 10, whereby the digital PGA 7 performs gain control. Simultaneously, a control signal from the gain control circuit 10 is also supplied to the analog PGA 4 through a gain conversion table 11. It is noted that because the gain control responses to the control signal are different between the analog PGA 4 and the digital PGA 7, the control signal is converted using the gain conversion table 11 so that both those responses may be equal.

Figure 2:
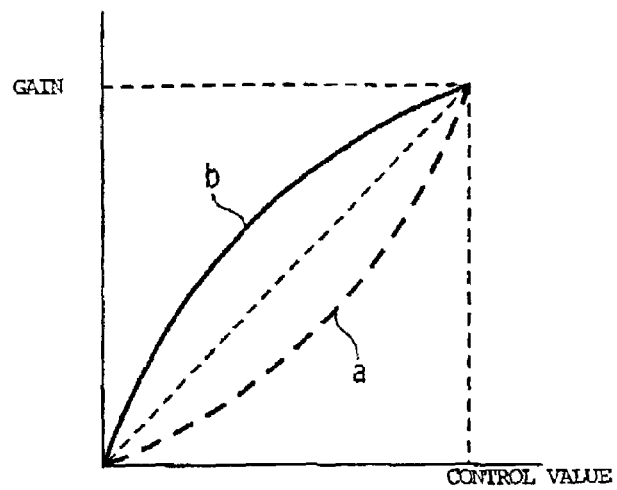
FIG. 2 is a diagram for explaining the operation thereof.
Figure 3A:
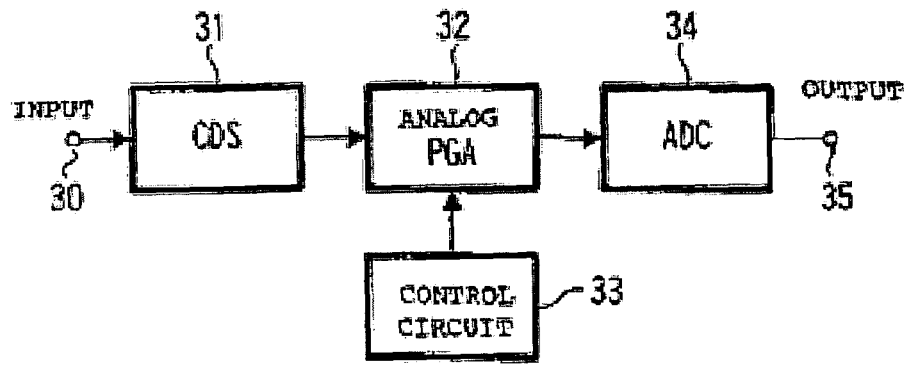
FIGS. 3A to 3C are structure diagrams showing conventional analog front end circuits.
Figure 3B:
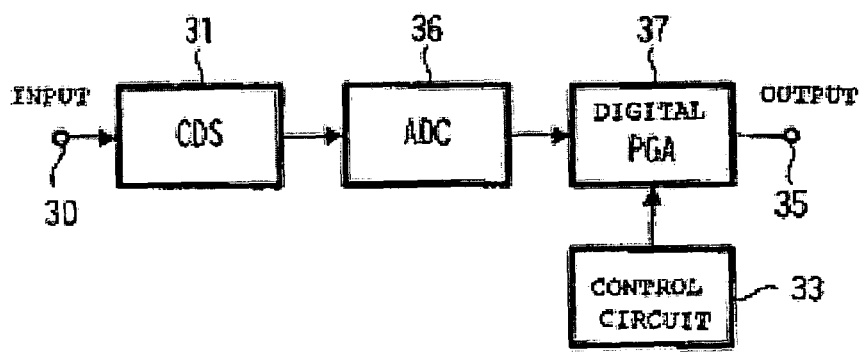
Figure 3C:
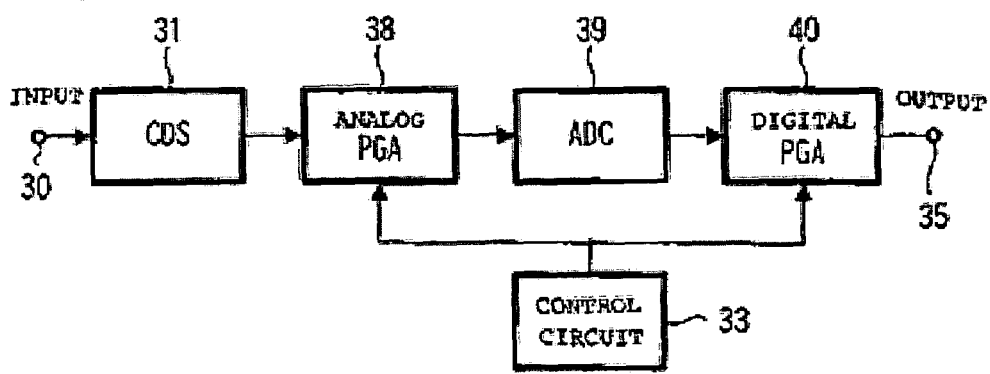

Specifically, for example, the control signal is output from the gain control circuit 10 to the digital PGA 7 so that a predetermined gain control response may be obtained. On the contrary, if the control signal is supplied to the analog PGA 4 as it is, the control response will be, for example, such one as indicated by a broken line a in FIG. 2. Thus, when the conversion table 11 which contains such a conversion characteristic as indicated by a solid line b in FIG. 2 is provided, the analog PGA 4 will also make the same control response as that of the digital PGA 7.

The PGA mode control circuit 9 has the following three operation modes. In a first operation mode, the amplification up to a predetermined gain is performed by the analog PGA 4 and the amplification thereafter is performed by the digital PGA 7. In a second operation mode, the gain of the analog PGA 4 is fixed and the amplification to the desired gain is performed by the digital PGA 7 in a third operation mode, the operation of the analog PGA 4 is stopped and the entire gain amplification is performed only by the digital PGA 7. By switching over those operation modes, the desired gain control is performed.

Specifically, when the gain is gradually increased, given that the maximum gain is, e.g. 36 dB, the analog PGA 4 is the gain control for 0 to 18 dB in the first operation mode. After the gain of the analog PGA 4 has reached 18 dB, the digital PGA 7 performs the gain control for 0 to 18 dB. In the second operation mode, for example, the analog PGA 4 is controlled for fixed the gain at an arbitrary value and the digital PGA 7 is controlled for the gain control for 0 to 36 dB.

Further, in the third operation mode, the operation of the analog PGA 4 is stopped, and the digital PGA 7 is controlled for the gain for 0 to 36 dB. In this connection, the PGA mode control circuit 9 further supplies a control signal to a power supply control circuit 12. The power supply control circuit 12 controls the power supply of the analog PGA 4. Also, by a control signal from the PGA mode control circuit 9, the changeover switches 3, 5 are activated for the selection of signal, whereby the operation of the analog PGA 4 is stopped.

It is noted that, the control signal from the PGA mode control circuit 9 for changing over the operation mode or for controlling the gain to be controlled is supplied as a data signal from the outside (not shown) through, for example, a data signal terminal 13. Additionally, the format of the data signal supplied through the data input terminal 13 may be of any type if only it is available for the above-described PGA mode control circuit 9. For example, there can be used a format of data signal which is common to the above-described analog front end circuit and the other circuits.

In a case where, for example, it is desired to reduce the power consumption in the above-described circuit as much as possible, it is preferable to make the operation mode to be the above-described third operation mode i.e. the full-digital mode. By doing so, it is possible to greatly reduce the power consumption by stopping the operation of the analog PGA 4. On the other hand when the reduction of noise is intended, it is preferable to make the operation mode which is the above-described first operation mode i.e. the hybrid mode. By doing so, it is possible to less the amplified gain by the digital PGA 7 and thereby suppress the amplification of noise generated in the preceding circuits.

Further, in the above-described second operation mode, in which is the digital mode with a pre-amplifier (fixed gain), the power is consumed as much as in the hybrid mode or the first operation mode, whereas more noise is generated than in the hybrid mode. However, in this second operation mode, because gain of the analog PGA 4 in use is unchanged, there will occur no inconvenience such as the transient phenomena due to the offset just as in the third operation mode, or the full-digital mode. Therefore, the satisfactory gain control can be performed.

On that account, when the above-described circuit is used in an electronic still camera, because noise generation is permitted, in a monitor mode in which a picked-up image is only displayed in the finder, the operation mode is made to be the full-digital mode in which the power consumption is the minimum. At the time of capturing or recording picked-up still images, the operation mode is made to be the hybrid mode in which the noise generation is the least. Additionally, the time required for the capturing is short and the operation mode after the capturing is returned again to the full-digital mode.

Also, when a moving image is picked up and recorded, the operation mode is made to enter the digital mode with a preamplifier, in which the noise generation is relatively small and there occurs no inconvenience such as transient phenomena. It is noted that, in case of the moving image, irregular noise, etc. generated in the circuit are not outstanding and some noise are permissible. By changing over the operation mode depending on the occasional use conditions or the like in this manner, it is possible to reduce the entire power consumption and also suppress the generation of noise to a tolerable extent.

Accordingly, because it is arranged, in this embodiment, that both the analog amplifier and digital amplifier are provided, and they are allowed to be switched over for use as needed, it is possible to change over the circuit according to the occasional use conditions, and thereby minimize the noise generation and the power consumption under those occasional use conditions. Therefore, according to the present invention, it is possible to overcome the problems of minimizing the noise generation and the power consumption which could not be solved by the conventional apparatus.

Additionally, because the above-described embodiment is provided with the gain conversion table 11, it is possible to control both of the analog PGA 4 and the digital PGA 7 by a single control signal for example. This eliminates the necessity of providing a conversion table for obtaining, e.g. a linear characteristic on a control software, thus allowing the entire gain control to be performed by a simple control signal. Further, such a gain conversion table can also be provided in the control system of the PGA 7. Alternatively, the table can also be provided in the both systems of control so as to control the PGA 4 and the PGA 7.

Moreover, the above-described embodiment has the third operation mode in which the changeover switches 3, 5 provided in front of and behind the analog PGA 4 is activated to make the analog PGA 4 bypassed and a control signal is supplied to the power supply control circuit 12 to make the power supply of the analog PGA 4 stopped. Therefore, in the third operation mode, or the full-digital mode, it is possible to make the power consumption at the analog PGA 4 completely null and thereby minimize the entire power consumption.

Furthermore, the above-described circuit can be unified together with a correlated double sampling circuit (CDS) into an integrated circuit. By doing so, it is possible to form an extremely efficient analog front end circuit which enables the operation mode to be arbitrarily changed over according to the occasional use conditions. Consequently, the analog front end circuit which is adapted for such occasional use conditions that stress is placed upon the reduction in the power consumption, or stress is placed upon obtaining a low-noise image signal, etc. can be realized as a single integrated circuit.

As described above, the analog front end circuit comprises: the analog amplifier which receives the analog signal and the gain of which is controllable; the analog digital converter which digitizes the output of the analog amplifier; and the digital amplifier which multiplies the output of the analog digital converter by an arbitrary value; wherein, in the first operation mode, the amplification to a predetermined gain is performed by the analog amplifier; in the amplification thereafter is performed by the digital amplifier; in the second operation mode, the gain of the analog amplifier is fixed and the amplification up to a desired gain is performed by the digital amplifier, and the third operation mode in which the operation of the analog amplifier is stopped and the amplification for the entire gain is performed only by the digital amplifier; and the desired signal processing is performed by switching over the operation mode among the first to the third operation modes. Therefore, by switching over the circuit according to the use conditions, the noise generation and the power consumption under those occasional use conditions can be minimized.

It is noted that the present invention is not limited to the above-mentioned embodiment, but various modifications are possible without departing from the spirit of the present invention.

In short, according to the present invention, because it is arranged that both the analog amplifier and the digital amplifier are provided and those amplifiers can be switched over for use as needed, by changing over the circuit according to the occasional use conditions, it is possible to minimize the noise generation and the power consumption under those occasional use conditions.

Moreover, according to the present invention, performing the gain control of the analog and digital amplifiers by a single control signal and by providing the signal conversion table in one of the gain control systems for the analog and digital amplifiers makes it unnecessary to provide a conversion table for obtaining, e.g. a linear characteristic on a control software. Therefore, it becomes possible to perform the overall gain control by a simple control signal.

Furthermore, according to the invention, a bypass line is provided via the changeover switches in front of and behind the analog amplifier, and in the third operation mode, the analog amplifier is bypassed and at the same time the power supply of the analog amplifier is cut off by activating over the changeover switches. Thus, in the full-digital mode which is the third operation mode, it is possible to make the power consumption of the analog amplifier completely null and the entire power consumption can be minimized.

In addition, according to the present invention, because the analog amplifier, analog digital converter and digital amplifier are unified into an integrated circuit including the correlated double sampling circuit for taking out the image signal from the charge coupled device, an analog front end circuit which is adapted for such occasional use conditions that stress is placed upon the reduction in the power consumption, or stress is placed upon obtaining low-noise image signals can be realized as a single integrated circuit.

Consequently, according to the present invention, it is possible to easily overcome those problems of minimizing the noise generation and the power consumption which could not be solved by the conventional apparatus.

DESCRIPTION OF REFERENCE NUMERALS

1 . . . INPUT TERMINAL
2 . . . CORRELATED DOUBLE SAMPLING CIRCUIT (CDS)
3, 5 . . . CHANGEOVER SWITCHES
4 . . . ANALOG TYPE PROGRAMMABLE GAIN CONTROL AMPLIFIER (ANALOG PGA)
6 . . . ANALOG DIGITAL CONVERTER (ADC)
7 . . . DIGITAL TYPE PROGRAMMABLE GAIN CONTROL AMPLIFIER (DIGITAL PGA)
8 . . . OUTPUT TERMINAL
9 . . . PGA MODE CONTROL CIRCUIT

10 . . . GAIN CONTROL CIRCUIT
11 . . . GAIN CONVERSION TABLE
12 . . . POWER SUPPLY CONTROL CIRCUIT
13 . . . DATA INPUT TERMINAL
30 . . . INPUT TERMINAL
31 . . . CORRELATED DOUBLE SAMPLING CIRCUIT (CDS)
32, 38 . . . ANALOG TYPE PROGRAMMABLE GAIN CONTROL AMPLIFIER (ANALOG PGA)
33 . . . CONTROL CIRCUIT
34, 36, 39 . . . ANALOG DIGITAL CONVERTERS (ADC)
35 . . . OUTPUT TERMINAL
37, 40 . . . DIGITAL TYPE PROGRAMMABLE GAIN CONTROL AMPLIFIER (DIGITAL PGA)

The invention claimed is:

1. An analog front end circuit comprising:
an analog amplifier which receives an analog signal and the gain of which is controllable;
an analog digital converter which digitizes the output of the analog amplifier; and
a digital amplifier which multiplies the output of the analog digital converter by an arbitrary value, wherein
in a first operation mode, the amplification up to a predetermined gain is performed by said analog amplifier and the amplification thereafter is performed by said digital amplifier,
in a second operation mode, the gain of said analog amplifier is fixed and the amplification to a desired gain is performed by said digital amplifier,
in a third operation mode, the operation of said analog amplifier is stopped and the amplification for the entire gain is performed only by said digital amplifier,
said operation mode is switched over among said first to third operation modes, to perform desired signal processing,
a bypass line is provided via changeover switches provided in front of and behind said analog amplifier, and
in said third operation mode, by activating the changeover switches, said analog amplifier is bypassed and a power supply of said analog amplifier is cut off.

2. An analog front end circuit according to claim 1, wherein
the gain controls of said analog amplifier and said digital amplifier are performed by a single control signal; and
a signal conversion table is provided in one or both of the gain control systems of said analog amplifier and said digital amplifier.

3. An analog front end circuit according to claim 1, wherein
said analog amplifier, said analog digital converter, and said digital amplifier are unified into an integrated circuit including a correlated double sampling circuit for taking out an image signal from a charge coupled device.

* * * * *